(12) United States Patent
McKernan

(10) Patent No.: US 8,072,971 B2
(45) Date of Patent: Dec. 6, 2011

(54) PLATFORM ARCHITECTURE AND METHOD FOR MAKING SAME

(75) Inventor: Thomas W. McKernan, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 1713 days.

(21) Appl. No.: 11/065,948

(22) Filed: Feb. 25, 2005

(65) Prior Publication Data

US 2006/0193346 A1  Aug. 31, 2006

(51) Int. Cl.
*H04L 12/50* (2006.01)
(52) U.S. Cl. .................................. 370/366; 710/305
(58) Field of Classification Search .................. None
See application file for complete search history.

(56) References Cited

U.S. PATENT DOCUMENTS

| | | | |
|---|---|---|---|
| 6,901,072 B1 * | 5/2005 | Wong | 370/389 |
| 6,928,022 B2 * | 8/2005 | Cho et al. | 365/225.7 |
| 2001/0009523 A1 * | 7/2001 | Maeno | 365/201 |
| 2003/0217215 A1 * | 11/2003 | Taborek et al. | 710/305 |
| 2004/0017815 A1 * | 1/2004 | Huff | 370/395.53 |
| 2004/0022238 A1 * | 2/2004 | Kimmitt | 370/366 |
| 2004/0068593 A1 * | 4/2004 | Helenic et al. | 710/71 |
| 2004/0114622 A1 * | 6/2004 | Nation et al. | 370/465 |
| 2004/0116120 A1 * | 6/2004 | Gallagher et al. | 455/436 |
| 2005/0117388 A1 * | 6/2005 | Cho et al. | 365/163 |
| 2005/0175018 A1 * | 8/2005 | Wong | 370/396 |

* cited by examiner

*Primary Examiner* — Ayaz Sheikh
*Assistant Examiner* — Faiyazkhan Ghafoerkhan
(74) *Attorney, Agent, or Firm* — Suiter Swantz pc llo

(57) ABSTRACT

The present invention provides an architecture for a platform, which includes (1) gates located in a central area of a die for supporting an application layer; (2) a SerDes region located at one side of the die for holding at least one SerDes device; (3) a Link Layer Controller region, located adjacent the SerDes region and between the SerDes region and the gates, for supporting the at least one SerDes device; and (4) at least one RAM array for supporting the at least one SerDes device, the at least one RAM array being located at least one of adjacent the gates or between the gates and the Link Layer Controller region.

20 Claims, 5 Drawing Sheets

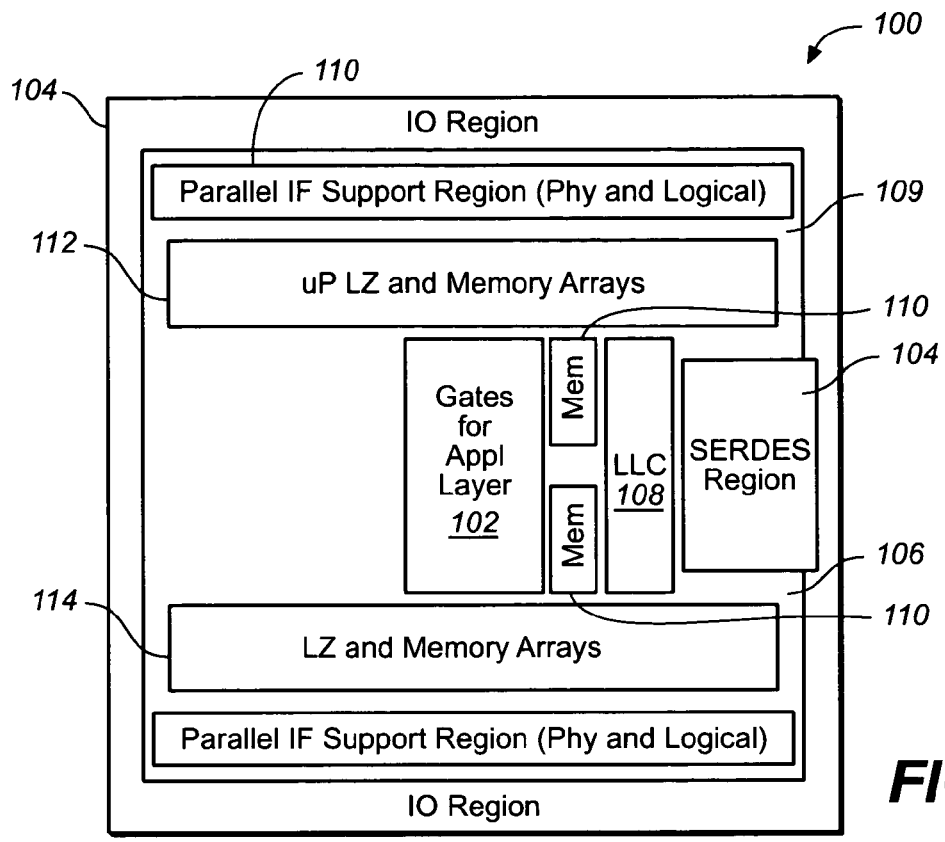
FIG._1
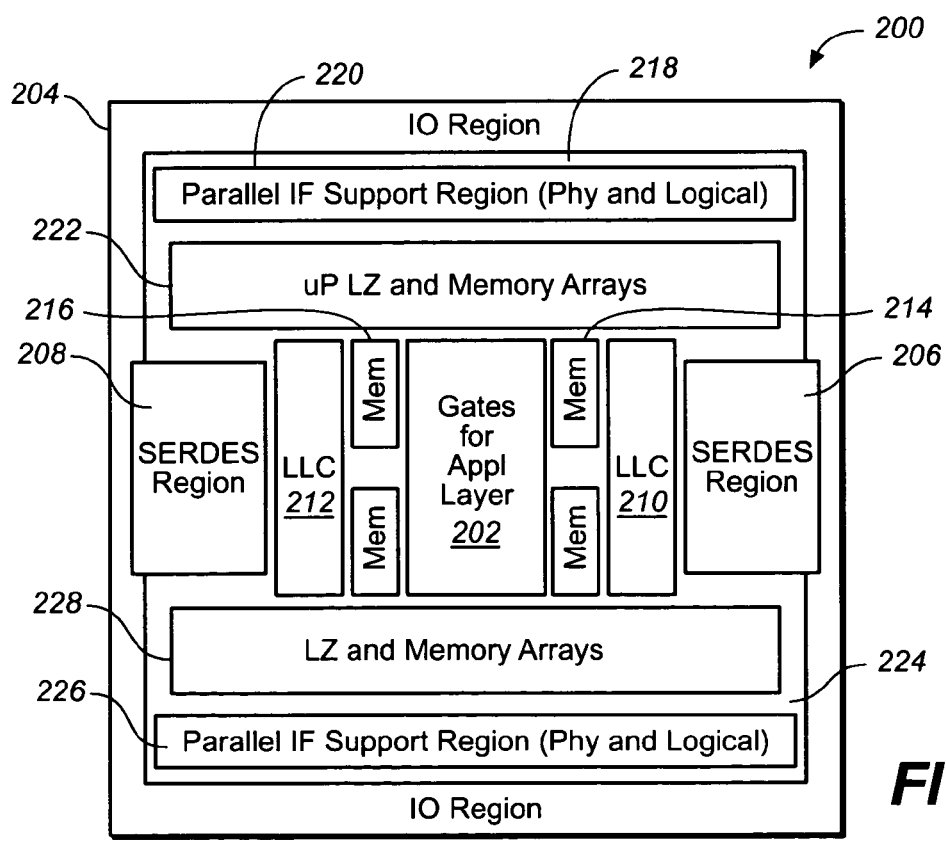
FIG._2

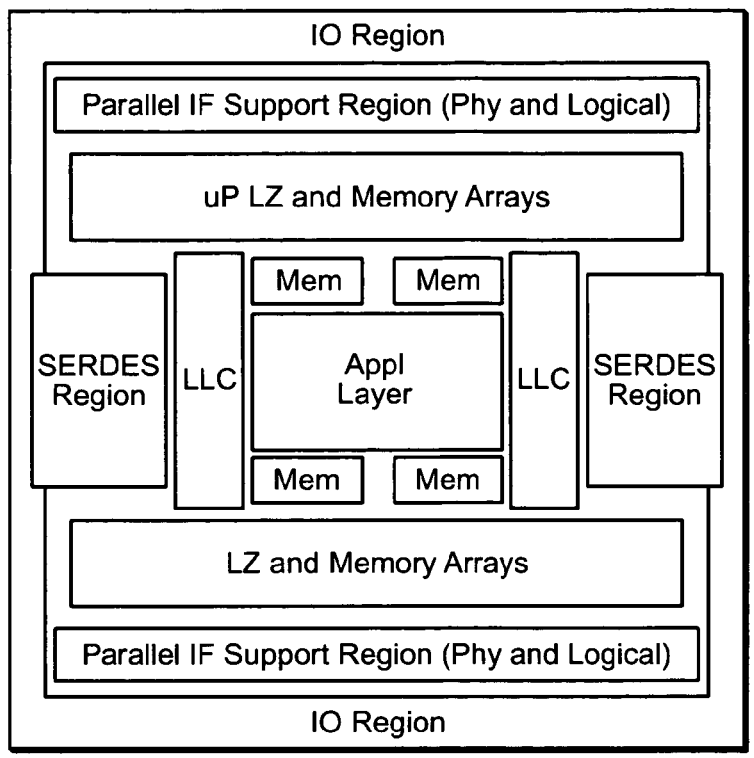
FIG._2A
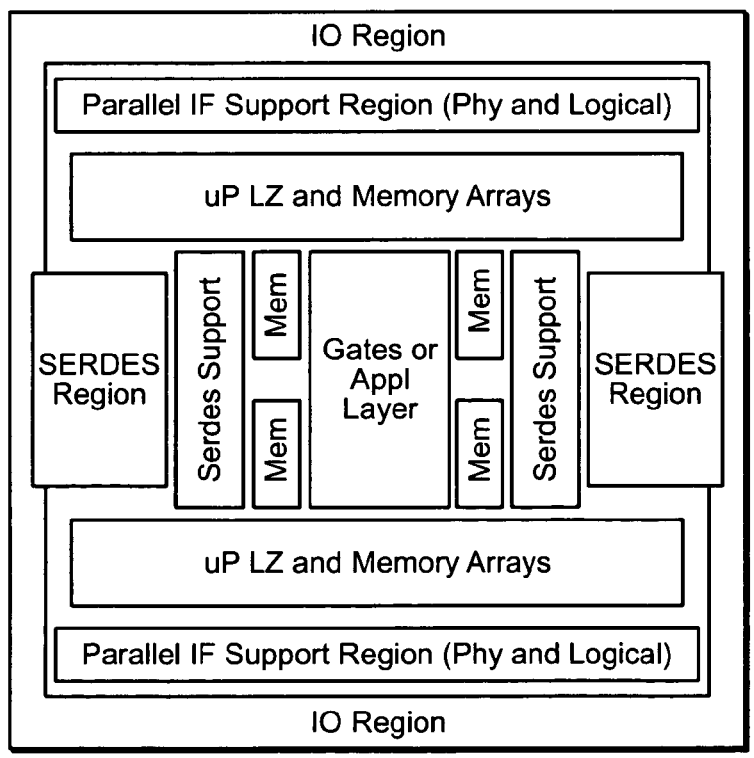
FIG._3

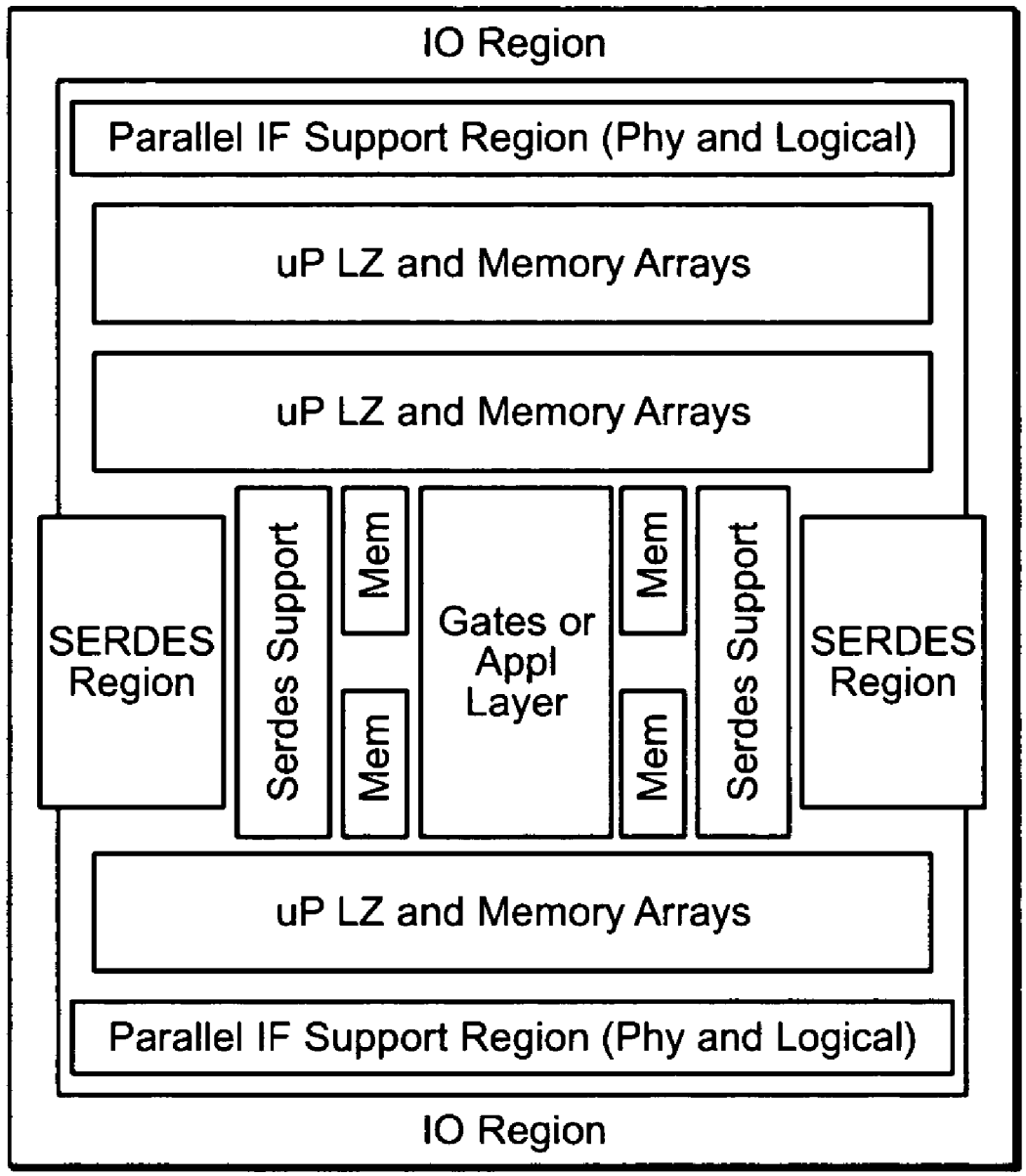
FIG._4

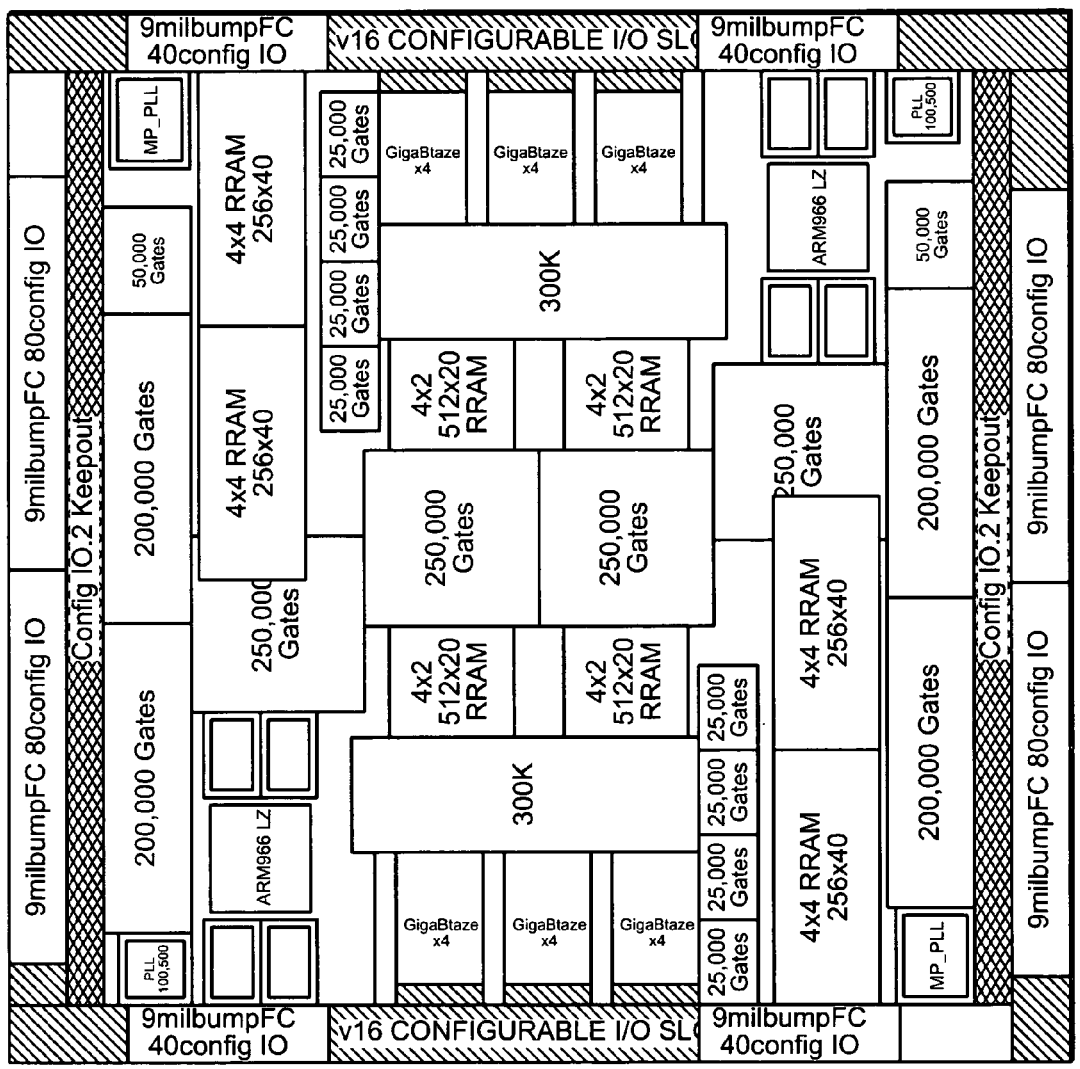
FIG._5

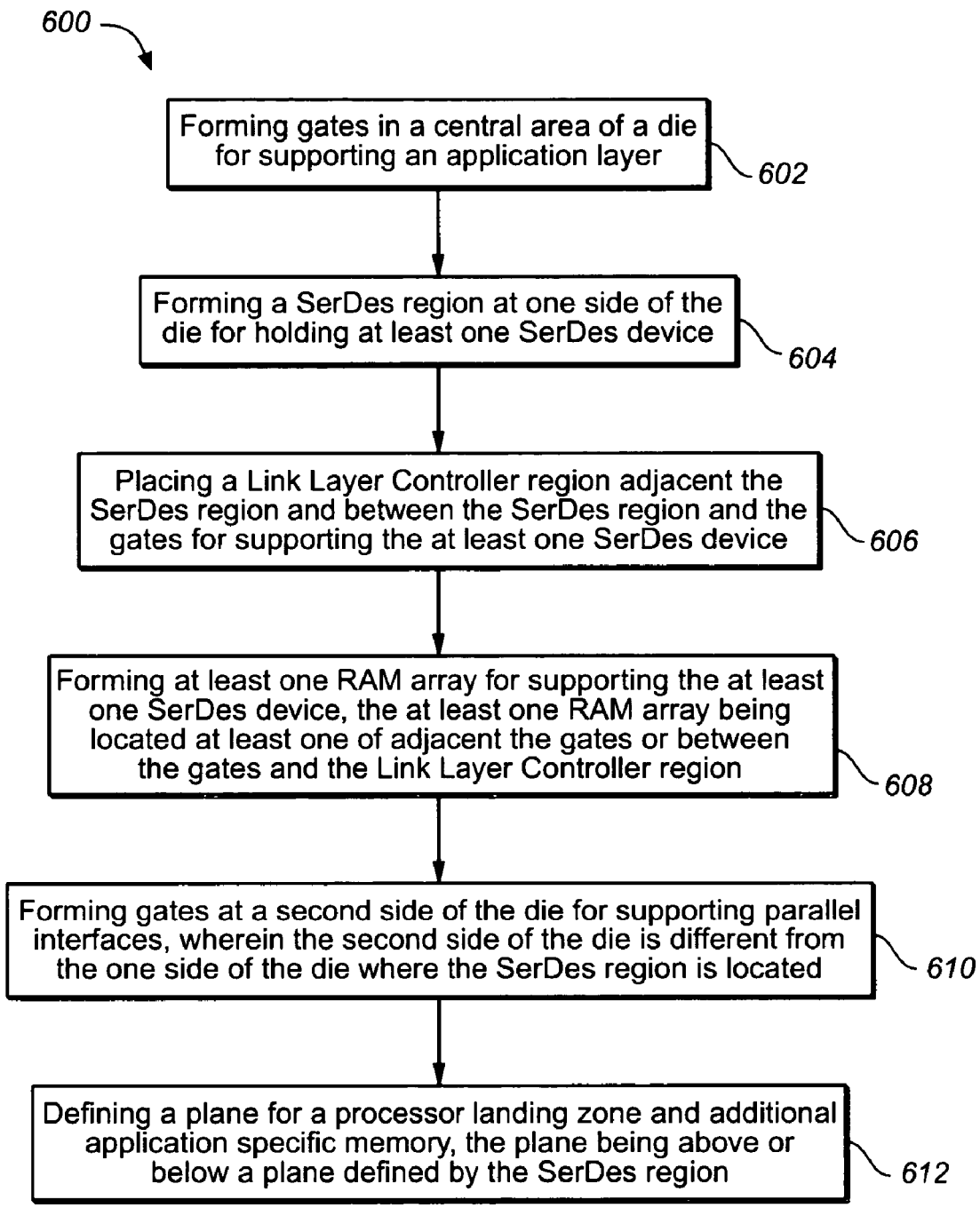
FIG._6

PLATFORM ARCHITECTURE AND METHOD FOR MAKING SAME

FIELD OF THE INVENTION

The present invention generally relates to the field of integrated circuits, particularly to a platform architecture and a method for making the platform architecture.

BACKGROUND OF THE INVENTION

Platform-based IC (integrated circuit) design is a powerful concept for coping with the increased pressure on time-to-market, design and manufacturing costs encountered in the current IC market. A platform is a large-scale, high-complexity semiconductor device that includes one or more of the following elements: (1) memory; (2) a customizable array of transistors; (3) an IP (intellectual property) block; (4) a processor, e.g., an ESP (embedded standard product); (5) an embedded programmable logic block; and (6) interconnect. RapidChip™ developed by LSI Logic Corp. is an instance of a platform. The basic idea behind the platform-based design is to avoid designing and manufacturing a chip from scratch. Some portion of the chip's architecture is predefined for a specific type of application. Through extensive design reuse, the platform-based design may provide faster time-to-market and reduced design cost.

Under a platform approach, there are two distinct steps entailed in creating a final end-user product: a prefabrication step and a customization step. In a prefabrication step, a slice is built on a wafer. A slice is a pre-manufactured chip in which all silicon layers have been built, leaving the metal layers or top metal layers to be completed with the customer's unique IP. For example, RapidSlice™ developed by LSI Logic Corp. is an instance of a slice. One or more slices may be built on a single wafer. It is understood that a slice may include one or more bottom metal layers or may include no metal layers at all. In a preferred embodiment of the prefabrication step, portions of the metal layers are pre-specified to implement the pre-defined blocks of the platform and the diffusion processes are carried out in a wafer fab. The base characteristics, in terms of the IP, the processors, the memory, the interconnect, the programmable logic and the customizable transistor array, are all pre-placed in the design and pre-diffused in the slice. However, a slice is still fully decoupled because the customer has not yet introduced the function into the slice. In a customization step, the customer-designed function is merged with the pre-defined blocks and the metal layers (or late-metal components) are laid down, which couple the elements that make up the slice built in the wafer fab, and the customizable transistor array is configured and given its characteristic function. In other embodiments, early-metal steps may be part of the pre-fabricated slice to reduce the time and cost of the customization step, resulting in a platform which is more coupled and specific. It is understood that a prefabrication step and a customization step may be performed in different foundries. For example, a slice may be manufactured in one foundry. Later, in a customization step, the slice may be pulled from inventory and metalized, which gives the slice its final product characteristics in a different foundry.

Within the past several years, platforms have emerged as a viable alternative to cell-based ASICs (Application Specific Integrated Circuits) and FPGAs (Field Programmable Gate Arrays). Platforms fit the gap for those designs where the resources and costs of a cell-based ASIC are not justified, nor the pricing or performance of an FPGA. The platform is intended to provided quicker time to market and lower initial costs of a cell-based ASIC, but at a performance and capability of the cell-based ASIC. On the other hand, FPGAs, although offering a quicker time to market at lower initial costs, become prohibitive at larger volumes or where ASIC like performance is needed. For example, a 130 nm platform offers better gate density and performance for a given square millimeter than a 90 nm FPGA.

One of the biggest challenges facing platforms is design fit. In comparing platforms to cell-based ASICs, much of the differences come from the base layers of the wafer which are fixed for platforms. For a given platform, the number of gates, the number of memory instances and bits, as well as specialized diffused IP (intellectual property), are pre-determined. The selection of the IP and the placement of the IP in the architecture of the platform will determine the success or fit of the platform to multiple customer requirements.

In addition, for the platform vendor, the challenge is to define a core platform architecture that is efficient and flexible, so that it can be maintained and leveraged across multiple platforms, to lower the inherent design and development costs of the platform family, and to provide a competitive advantage.

The conventional solution to defining platforms is to either maintain the same architecture currently supported by FPGAs which is memory centric or take an ASIC mentality that is gate centric. In the FPGA based architecture, the structure of the architecture is focused on memory placement and access, with gates added to support the memories. With an ASIC based platform approach, the focus is adding memories to support the gates, and is typically a point solution with specific requirements embedded to address specific applications (vs. a wide range of applications). Neither approach adequately or generically addresses the SerDes (Serializer/Deserializer) requirements with respect to high end platforms.

Thus, it is desirable to provide an architecture and method for a platform which may address the SerDes requirements.

SUMMARY OF THE INVENTION

In an exemplary aspect, the present invention provides an architecture for a platform, which includes (1) gates located in a central area of a die for supporting an application layer; (2) a SerDes region located at one side of the die for holding at least one SerDes device; (3) a Link Layer Controller region, located adjacent the SerDes region and between the SerDes region and the gates, for supporting the at least one SerDes device; and (4) at least one RAM array for supporting the at least one SerDes device, the at least one RAM array being located at least one of adjacent the gates or between the gates and the Link Layer Controller region.

In an additional exemplary aspect, the present invention provides an architecture for a platform, which includes (1) gates located in a central area of a die for supporting an application layer; (2) a first SerDes region and a second SerDes region located at opposite sides of the die for holding at least one SerDes device; (3) a first Link Layer Controller region located adjacent the first SerDes region and between the first SerDes region and the gates; (4) a second Link Layer Controller region located adjacent the second SerDes region and between the second SerDes region and the gates; (5) a first plurality of RAM arrays located at lease one of adjacent the gates or between the gates and the first Link Layer Controller region for supporting the at least one SerDes device; and (6) a second plurality of RAM arrays located at lease one of adjacent the gates or between the gates and the second Link Layer Controller region for supporting the at least one SerDes device, wherein at least one of the first Link Layer Controller region or the second Link Layer Controller region is suitable for supporting the at least one SerDes device.

In another exemplary aspect, the present invention provides a method for implementing a platform layout. Gates are formed in a central area of a die for supporting an application layer. A SerDes region is formed at one side of the die for holding at least one SerDes device. A Link Layer Controller region is placed adjacent the SerDes region and between the SerDes region and the gates for supporting the at least one SerDes device. At least one RAM array is formed for supporting the at least one SerDes device, the at least one RAM array being located at least one of adjacent the gates or between the gates and the Link Layer Controller region.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a schematic diagram illustrating a platform architecture in accordance with an exemplary embodiment of the present invention;

FIGS. 2 and 2A are schematic diagrams illustrating a platform architecture in accordance with additional exemplary embodiments of the present invention;

FIGS. 3 and 4 are schematic diagrams illustrating more exemplary platform architectures in accordance with the present invention;

FIG. 5 is an exemplary platform layout in accordance with the present invention; and FIG. 6 is a flow diagram of a method for implementing a platform layout in accordance with an exemplary embodiment of the present invention.

DETAILED DESCRIPTION OF THE INVENTION

Reference will now be made in detail to the presently preferred embodiments of the invention, examples of which are illustrated in the accompanying drawings.

To address flexibility in the number and portioning of resources with semi-independent selection of IO (input/output), memory instances count and size, supported interfaces (IFs), and Serdes type to support targeted applications, it is desired to define a common architecture across a family of platforms.

The present invention provides a platform architecture which focuses on being IF and Serdes centric, with the intent to optimize both gates and memories to support the Serdes and other IF requirements, in both content and placement. In an exemplary aspect, Serdes and other IFs are placed on the platform to support external board requirements. Adequate amount and ratio of memories and gates are placed in the platform to support the requirements (access, performance, content) of the IFs on the slice. For example, a Serdes application requires specific FIFO (first-in first-out), packet and frame buffers to support the Serdes. The memory size and placement need to be available to support this requirement. For a given protocol stack, an adequate number of gates need to be available to support the Serdes, and located in such a manner to support the performance requirements.

The present architecture allows for a commonality in floorplans and leveragability of resources amongst members in a platform family. The present invention allows for leveragability in developing a family of slices, support for customer applications, and a recognized and consistent architecture for design by customers. The present architecture may allow for inter- and intra-family scalability.

Specifics of the present architecture may be defined by the following: (1) slice layout/memory placement; (2) SerDes based applications requirements; (3) gate location requirements; (4) enough gates to support Link Layer Controller (LLC) requirements next to the SerDes; (5) gates on the non-SerDes side(s) to support parallel interfaces such as DDR (Double Date Rate), QDR (Quad Date Rate), PCIX (Peripheral Component Interconnect Extended), etc; and (6) gates in the center of a die to support application layer-such as x-bar for switch applications, transaction layers for adaptors, etc.

These specifics may result in a platform architecture with a central area in the middle of the layout that is gates only, surround by RAM arrays to support LLC Packet/Frame Buffering. The Serdes region is centrally located on one side or opposite sides to allow for easier access into and out of the chip, and also allow for easier migration of a given platform in multiple package types. In the area defined above and below a plane defined by the Serdes, the planes for processor landing zones and additional application specific memories may be defined, the size of which may be limited by the size of the die. The number of planes is also dependent on the size of the die (see, e.g., FIGS. 1 through 4). Room may be allocated around the memories and Serdes to allow for adequate routing channels.

The present architecture may allow for easy growth across a family through the addition or deletion of Serdes devices in the Serdes Zone, likewise in the growth or reduction of the Memory and Gate Zones. Additional Zones can also be added to expand the content.

Now referring to FIG. 1, a schematic diagram illustrating a platform architecture 100 in accordance with an exemplary embodiment of the present invention is shown. The architecture 100 may include gates 102 located in a central area of a die 104 for supporting an application layer such as x-bar for switch applications, transaction layers for adaptors, etc. A SerDes region 104 may be located at one side 106 of the die 104 for holding at least one SerDes device. The SerDes device may be Hydra SerDes or GigaBlaze® SerDes developed by LSI Logic Corp., or the like. Preferably, the SerDes region 104 is centrally located at the side 106 of the die 104. A Link Layer Controller region 108 (comprised of gates) may be located adjacent the SerDes region 104 and between the SerDes region 104 and the gates 102 for supporting the SerDes device. At least one RAM array 110 may be located at least one of adjacent the gates 102 (see, e.g., FIG. 2A) or between the gates 102 and the Link Layer Controller region 108 for supporting the SerDes device. The RAM array 110 may be suitable for supporting packet and frame buffers of a Link Layer Controller. The RAM array 110 may be a RRAM array. A RRAM (Reconfigurable RAM, or Redundant RAM, or RapidSlice™ RAM) is a set of memories of the same type that are placed compactly and include built-in testing and self-repairing components.

The architecture 100 may include gates located at a second side 109 of the die 104 for supporting parallel interfaces 110 such as DDR, QDR, PCIX, etc. The second side 109 of the die 104 is different from the side 106 of the die 104 where the SerDes region 104 is located. The architecture 100 may also include a plane defined for a processor landing zone and additional application specific memory 112 (or 114), which is above (or below) a plane defined by the SerDes region 104.

FIG. 2 is a schematic diagram illustrating a platform architecture 200 in accordance with an additional exemplary embodiment of the present invention. The architecture 200 may include gates 202 located in a central area of a die 204 for supporting an application layer such as x-bar for switch applications, transaction layers for adaptors, etc. A first SerDes region 206 and a second SerDes region 208 may be located at opposite sides of the die 204 for holding at least one SerDes device. The SerDes device may be Hydra SerDes or GigaBlaze® SerDes developed by LSI Logic Corp., or the like. Preferably, the SerDes regions 206, 208 are centrally located at the opposite sides of the die 104. A first Link Layer Controller region (comprised of gates) 210 is located adjacent the first SerDes region 206 and between the first SerDes region 206 and the gates 202. A second Link Layer Controller region (comprised of gates) 212 is located adjacent the second SerDes region 208 and between the second SerDes region 208 and the gates 202. A first plurality of RAM arrays 214 are located at least one of adjacent the gates 202 (see, e.g., FIG. 2A) or between the gates 202 and the first Link Layer Controller region 210 (see, e.g., FIG. 2) for supporting the at least one SerDes device. A second plurality of RAM arrays 216 are located at least one of adjacent the gates 202 (see, e.g., FIG. 2A) or between the gates 202 and the second Link Layer Controller region 212 (see, e.g., FIG. 2) for supporting the at least one SerDes device. At least one of the first Link Layer Controller region 210 or the second Link Layer Controller region 212 is suitable for supporting the at least one SerDes device. The RAM arrays 214, 216 may be suitable for supporting packet and frame buffers of a Link Layer Controller. The RAM arrays 214, 216 may be a RRAM array. A RRAM (Reconfigurable RAM, or Redundant RAM, or RapidSlice™ RAM) is a set of memories of the same type that are placed compactly and include built-in testing and self-repairing components.

The architecture 200 may include gates located at a third side 218 of the die 204 for supporting parallel interfaces 220 such as DDR, QDR, PCIX, etc. The third side 218 of the die 204 is different from the opposite sides of the die 204 where the SerDes regions 206, 208 are located. The architecture 200 may also include a plane defined for a processor landing zone and additional application specific memory 222, which may be above (or below) a plane defined by the SerDes regions 206, 208. The architecture 200 may also include gates located at a fourth side 224 of the die 204 for supporting parallel interfaces 226 such as DDR, QDR, PCIX, etc. The fourth side 224 of the die 204 is opposite to the third side 218 of the die 204. The architecture 200 may also include a plane defined for a processor landing zone and additional application specific memory 228, which may be below (or above) a plane defined by the SerDes regions 206, 208.

FIGS. 3 and 4 are schematic diagrams illustrating more exemplary platform architectures in accordance with the present invention, and FIG. 5 is an exemplary platform layout in accordance with the present invention.

FIG. 6 is a flow diagram of a method 600 for implementing a platform layout in accordance with an exemplary embodiment of the present invention. Gates are formed in a central area of a die for supporting an application layer such as x-bar for switch applications, transaction layers for adaptors, or the like 602. A SerDes region is formed at one side of the die for holding at least one SerDes device 604. The SerDes device may be Hydra SerDes or GigaBlaze® SerDes developed by LSI Logic Corp., or the like. Preferably, the SerDes region is centrally located at the side of the die. A Link Layer Controller region (comprised of gates) is placed adjacent the SerDes region and between the SerDes region and the gates for supporting the SerDes device 606. At least one RAM array is formed for supporting the at least one SerDes device, the at least one RAM array being located at least one of adjacent the gates or between the gates and the Link Layer Controller region 608. The RAM array may be a RRAM array. A RRAM (Reconfigurable RAM, or Redundant RAM, or RapidSlice™ RAM) is a set of memories of the same type that are placed compactly and include built-in testing and self-repairing components. Gates are formed at a second side of the die for supporting parallel interfaces such as DDR, QDR, PCIX, or the like 610. The second side of the die is different from the side of the die where the SerDes region is located. A plane is defined for a processor landing zone and additional application specific memory, which is above or below a plane defined by the SerDes region.

The present invention may have the following features. First, the present invention may support efficient definition, flexibility, and use of platforms, and allow for efficient reuse of a base architecture through a family, regardless of the memory, gate, SerDes, and IO requirements. Efficient design reuse of a baseline architecture may hasten development of new platforms. Flexible and consistent architecture may enable a customer to migrate within a family of platforms. In addition, the present invention may allow and support easy migration from one slice to the next in the event resource requirements change, and enable easier reuse in the design and development of platforms within a family. Moreover, the present invention may provide a platform architecture that readily supports a wide range of customer based-Serdes applications in form, fit, and function. The availability and placement of resources within the present platform architecture may support a wide range of applications. Furthermore, content of the present platform architecture may efficiently support the targeted applications. Moreover, the present invention may provide the ability to efficiently address the large number of degrees of freedom (DOF) in leveraging a family architecture (gates, memory bits, memory instances, Serdes type and count, and IO) into developing a useable family. Additionally, the present invention may provide a platform family that leverages an architecture to specifically solve hi-speed interface (Serdes) based applications, that is recognizable and re-useable by the user.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An architecture for a platform, comprising:
gates located in a central area of a die for supporting an application layer;
a SerDes region configured for access and platform migration in multiple semiconductor packages, located at one side of said die for holding at least one SerDes device;
a Link Layer Controller region, adjacent said SerDes region and between said SerDes region and said gates, for supporting said at least one SerDes device; and
at least one RAM array for supporting said at least one SerDes device, said at least one RAM array configured for supporting Link Layer Controller buffering, being located at least one of adjacent said gates or between said gates and said Link Layer Controller region.

2. The architecture of claim 1, wherein said at least one RAM array includes at least one array of compactly-placed memory cells of the same type including built-in testing and self-repairing components.

3. The architecture of claim 1, wherein said SerDes region is centrally located at said one side of said die.

4. The architecture of claim 1, wherein said at least one RAM array is suitable for supporting packet and frame buffers of a Link Layer Controller.

5. The architecture of claim 1, further comprises gates located at a second side of said die for supporting parallel interfaces, wherein said second side of said die is different from said one side of said die where said SerDes region is located.

6. The architecture of claim 5, further comprises a plane defined for a processor landing zone and additional application specific memory, said plane being above or below a plane defined by said SerDes region.

7. An architecture for a platform, comprising:
gates located in a central area of a die for supporting an application layer;
a first SerDes region and a second SerDes region configured for easier access and platform migration in multiple semiconductor packages, located at opposite sides of said die for holding at least one SerDes device;
a first Link Layer Controller region located adjacent said first SerDes region and between said first SerDes region and said gates;
a second Link Layer Controller region located adjacent said second SerDes region and between said second SerDes region and said gates;
a first plurality of RAM arrays configured for supporting Link Layer Controller buffering, located at lease one of adjacent said gates or between said gates and said first Link Layer Controller region for supporting said at least one SerDes device; and
a second plurality of RAM arrays located at lease one of adjacent said gates or between said gates and said second Link Layer Controller region for supporting said at least one SerDes device,
wherein at least one of said first Link Layer Controller region or said second Link Layer Controller region is suitable for supporting said at least one SerDes device.

8. The architecture of claim 7, wherein said first plurality of RAM arrays and said second plurality of RAM arrays are arrays of compactly-placed memory cells of the same type including built-in testing and self-repairing components.

9. The architecture of claim 7, wherein said first SerDes region and said second SerDes region are centrally located at said opposite sides of said die.

10. The architecture of claim 7, wherein said first plurality of RAM arrays are suitable for supporting packet and frame buffers of a Link Layer Controller.

11. The architecture of claim 7, wherein said second plurality of RAM arrays are suitable for supporting packet and frame buffers of a Link Layer Controller.

12. The architecture of claim 7, further comprises gates located at a third side of said die for supporting parallel interfaces, wherein said third side of said die is different from said opposite sides of said die where said first SerDes region and said second SerDes region are located.

13. The architecture of claim 12, further comprises a plane defined for a processor landing zone and additional application specific memory, said plane being above or below a plane defined by said first SerDes region and said second SerDes region.

14. The architecture of claim 12, further comprises gates located at a fourth side of said die for supporting parallel interfaces, wherein said fourth side of said die is opposite to said third side of said die.

15. The architecture of claim 14, further comprises a plane defined for a processor landing zone and additional application specific memory, said plane being above or below a plane defined by said first SerDes region and said second SerDes region.

16. A method for implementing a platform layout, comprising:
forming gates in a central area of a die for supporting an application layer;
forming a SerDes region configured for easier access and platform migration in multiple semiconductor packages, at one side of said die for holding at least one SerDes device;
placing a Link Layer Controller region adjacent said SerDes region and between said SerDes region and said gates for supporting said at least one SerDes device; and
forming at least one RAM array for supporting said at least one SerDes device, said at least one RAM array configured for supporting Link Layer Controller buffering, being located-at least one of adjacent said gates or between said gates and said Link Layer Controller region.

17. The method of claim 16, wherein said at least one RAM array includes at least one array of compactly-placed memory cells of the same type including built-in testing and self-repairing components.

18. The method of claim 16, wherein said SerDes region is centrally located at said one side of said die.

19. The method of claim 16, further comprises forming gates at a second side of said die for supporting parallel interfaces, wherein said second side of said die is different from said one side of said die where said SerDes region is located.

20. The method of claim 19, further comprises defining a plane for a processor landing zone and additional application specific memory, said plane being above or below a plane defined by said SerDes region.

* * * * *